(12) United States Patent
Seo et al.

(10) Patent No.: US 8,395,166 B2
(45) Date of Patent: Mar. 12, 2013

(54) LIGHT EMITTING DIODE AND METHOD OF FABRICATING THE SAME

(75) Inventors: Won Cheol Seo, Ansan-si (KR); Chang Youn Kim, Ansan-si (KR); Yeo Jin Yoon, Ansan-si (KR)

(73) Assignee: Seoul Opto Device Co., Ltd., Ansan-si (KR)

( * ) Notice: Subject to any disclaimer, the term of this patent is extended or adjusted under 35 U.S.C. 154(b) by 116 days.

(21) Appl. No.: 12/811,047

(22) PCT Filed: Dec. 24, 2008

(86) PCT No.: PCT/KR2008/007658
§ 371 (c)(1),
(2), (4) Date: Jun. 28, 2010

(87) PCT Pub. No.: WO2009/084857
PCT Pub. Date: Jul. 9, 2009

(65) Prior Publication Data
US 2010/0289040 A1 Nov. 18, 2010

(30) Foreign Application Priority Data

Dec. 28, 2007 (KR) .................. 10-2007-0140605
Dec. 22, 2008 (KR) .................. 10-2008-0131071

(51) Int. Cl.
*H01L 29/205* (2006.01)
*H01L 33/00* (2010.01)
(52) U.S. Cl. .................................. 257/91; 257/98
(58) Field of Classification Search .............. 257/80–82, 257/84, 85, 86, 96–98, 101, E33.056, E33.066, 257/E33.067, 91; 438/26–29, 45, 33
See application file for complete search history.

(56) References Cited

U.S. PATENT DOCUMENTS

| | | | |
|---|---|---|---|
| 2004/0245543 A1 | 12/2004 | Yoo | |
| 2005/0082564 A1* | 4/2005 | Kitaoka et al. | 257/103 |
| 2005/0167686 A1* | 8/2005 | Seo | 257/98 |
| 2005/0173714 A1* | 8/2005 | Lee et al. | 257/84 |
| 2006/0065905 A1* | 3/2006 | Eisert et al. | 257/95 |
| 2008/0001166 A1 | 1/2008 | Lee et al. | |

(Continued)

FOREIGN PATENT DOCUMENTS

| | | |
|---|---|---|
| JP | 2005-093649 | 4/2005 |
| JP | 2005-535143 | 11/2005 |

(Continued)

OTHER PUBLICATIONS

International Search Report of PCT/KR2008/007658 dated on Aug. 11, 2009.

(Continued)

*Primary Examiner* — Matthew Smith
*Assistant Examiner* — Wilner Jean Baptiste
(74) *Attorney, Agent, or Firm* — H.C. Park & Associates, PLC (57) ABSTRACT

Disclosed herein is a light emitting diode. The light emitting diode includes a support substrate, semiconductor layers formed on the support substrate, and a metal pattern located between the support substrate and the lower semiconductor layer. The semiconductor layers include an upper semiconductor layer of a first conductive type, an active layer, and a lower semiconductor layer of a second conductive type. The semiconductor layers are grown on a sacrificial substrate and the support substrate is homogeneous with the sacrificial substrate.

17 Claims, 6 Drawing Sheets

U.S. PATENT DOCUMENTS

| | | | | |
|---|---|---|---|---|
| 2008/0265265 | A1* | 10/2008 | Xiong et al. | 257/97 |
| 2009/0166645 | A1* | 7/2009 | Lee | 257/87 |
| 2009/0206354 | A1* | 8/2009 | Kitano et al. | 257/98 |

FOREIGN PATENT DOCUMENTS

| | | |
|---|---|---|
| JP | 2007-009114 | 1/2007 |
| JP | 2009-534289 | 9/2009 |
| KR | 10-2005-0012729 | 2/2005 |
| WO | 2004/017430 | 2/2004 |
| WO | 2007/121735 | 11/2007 |

OTHER PUBLICATIONS

Written Opinion of PCT/KR2008/007658 dated on Aug. 11, 2009.

* cited by examiner

LIGHT EMITTING DIODE AND METHOD OF FABRICATING THE SAME

CROSS-REFERENCE TO RELATED APPLICATIONS

This application is the National Stage of International Application No. PCT/KR2008/007658, filed Dec. 24, 2008, and claims priority from and the benefit of Korean Patent Application No. 10-2007-0140605, filed on Dec. 28, 2007, and Korean Patent Application No. 10-2008-0131071, filed on Dec. 22, 2008, which are all hereby incorporated by reference for all purposes as if fully set forth herein.

BACKGROUND OF THE INVENTION

1. Field of the Invention

The present invention relates to a light emitting diode and a method of fabricating the same, and more particularly, to a light emitting diode fabricated through a laser lift-off (LLO) process and a method of fabricating the same.

2. Discussion of the Background

Typically, a light emitting diode (LED) is formed by growing a GaN-based material on a substrate formed of GaN, sapphire, silicon, silicon nitride, and the like to emit light. In the LED with this structure, light is emitted from a light emitting layer located at an upper portion of the LED, travels above and below the light emitting layer, and is finally emitted from the LED through reflection, scattering, and refraction. To increase luminescence efficiency through refraction and reflection of light traveling above and below the light emitting layer, it is necessary to form a roughness on an upper side of the light emitting layer or to provide a reflection plate having good reflectivity to a lower side of the light emitting layer.

However, an upper side P-type layer of the light emitting layer is so thin that the roughness cannot be formed thereon or, if any roughness is formed thereon, provides an insignificant effect. Further, even when a metallic material having good reflectivity is deposited under the sapphire substrate located below the light emitting layer, some light is inevitably absorbed and disappears in the sapphire substrate. As such, when light is emitted from the lower part of the LED, it passes through the substrate where the light undergoes a significant loss. To reduce such a loss, a Si substrate or a metal substrate is provided to the LED for preventing absorption of light in the substrate while improving reflectivity, instead of using a sacrificial substrate, which has conventionally been used to grow semiconductor layers for use in the formation of the roughness or in the deposition of metal having high reflectivity to the substrate.

When using heterogeneous substrates instead of the sacrificial substrate, it is necessary to form an intermediate layer to bond the heterogeneous substrates to each other through application of heat and pressure from above and below the intermediate layer. During the application of heat and pressure, the heterogeneous substrates undergo deformation due to a difference in thermal expansion coefficient therebetween. Such deformation causes problems relating to characteristics and yield of subsequent processes.

SUMMARY OF THE INVENTION

The present invention is conceived to solve such problems of the related art as described above, and an aspect of the present invention is to provide a light emitting diode and method of fabricating the same, which can solve the problems of the related art.

In accordance with an aspect of the present invention, a light emitting diode includes a support substrate; semiconductor layers formed on the support substrate, the semiconductor layers including an upper semiconductor layer of a first conductive type, an active layer, and a lower semiconductor layer of a second conductive type; and a metal pattern located between the support substrate and the lower semiconductor layer, the semiconductor layers being grown on a sacrificial substrate and the support substrate being homogeneous with the sacrificial substrate.

The support substrate may be a sapphire substrate.

The support substrate may be formed at an upper or lower portion thereof with a plurality of grooves or through-holes filled with a metal.

The metal pattern may include a reflective metal layer on at least a portion of a lower surface of the lower semiconductor layer, and an intermediate metal layer covering the reflective metal layer.

The intermediate metal layer may include a protective metal layer.

The protective metal layer may be composed of multiple layers.

The intermediate metal layer may include a bonding metal layer.

The bonding metal layer may be composed of multiple layers.

The light emitting diode may further include an indium tin oxide (ITO) layer interposed between the lower semiconductor layer and the reflective metal layer.

The metal pattern may include a reflective metal layer on a lower surface of the lower semiconductor layer; and an intermediate metal layer between the reflective metal layer and the support substrate, the semiconductor layers being located on at least a portion of the reflective metal layer.

The reflective metal layer may include DBR layers partially formed therein.

The light emitting diode may further include electrode pads formed on the upper semiconductor layer and the metal pattern, respectively.

In accordance with another aspect of the present invention, a light emitting diode includes a support substrate; a plurality of metal patterns spaced from each other on the support substrate; light emitting cells located on at least some regions of the respective metal patterns, each light emitting cell including an upper semiconductor layer of a first conductive type, an active layer and a lower semiconductor layer of a second conductive type; metal wires electrically connecting upper surfaces of the light emitting cells to the metal patterns adjacent to the upper surfaces thereof, the semiconductor layers being grown on a sacrificial substrate and the support substrate being homogeneous with the sacrificial substrate.

The support substrate may be a sapphire substrate.

The support substrate may be formed at an upper or lower portion thereof with a plurality of grooves or through-holes, the grooves or through-holes being filled with metal.

The metal pattern may include a reflective metal layer on at least a portion of a lower surface of the lower semiconductor layer; and an intermediate metal layer covering the reflective metal layer.

The intermediate metal layer may include a protective metal layer.

The protective metal layer may be composed of multiple layers.

The intermediate metal layer may include a bonding metal layer.

The bonding metal layer may be composed of multiple layers.

The light emitting diode may further include an indium tin oxide (ITO) layer between the lower semiconductor layer and the reflective metal layer.

The metal pattern may include a reflective metal layer on a lower surface of the lower semiconductor layer; and an intermediate metal layer between the reflective metal layer and the support substrate, the semiconductor layers being located on at least a portion of the reflective metal layer.

The reflective metal layer may include DBR layers partially formed therein.

In accordance with a further aspect of the present invention, a method of fabricating a light emitting diode includes: forming semiconductor layers on a first substrate, the semiconductor layers including a buffer layer, a first conductive semiconductor layer, an active layer and a second conductive semiconductor layer; forming a metal pattern on the second conductive semiconductor layer; forming a second substrate on the metal pattern, the second substrate being homogeneous with the first substrate; separating the first substrate from the semiconductor layers; patterning the semiconductor layers and the metal pattern to form separated metal patterns and light emitting cells located on some regions of the respective separated metal patterns; and dicing the second substrate for each of the light emitting cells to provide individual chips.

The first and second substrates may be sapphire substrates.

The forming a metal pattern may include forming reflective metal layers separate from each other on the second conductive semiconductor layer; and forming an intermediate metal layer covering the second conductive semiconductor layer and the reflective metal layers.

The method may further include forming a plurality of grooves or through-holes at an upper or lower portion of the second substrate, and forming metal layers in the grooves or the through-holes, before forming the second substrate on the metal pattern.

In accordance with yet another aspect of the present invention, a method of fabricating a light emitting diode includes: forming semiconductor layers on a first substrate, the semiconductor layers including a buffer layer, a first conductive semiconductor layer, an active layer and a second conductive semiconductor layer; forming a metal pattern on the second conductive semiconductor layer; forming a second substrate on the metal pattern, the second substrate being homogeneous with the first substrate; separating the first substrate from the semiconductor layers; patterning the semiconductor layers and the metal pattern to form separated metal patterns and light emitting cells located on some regions of the respective separated metal patterns; and forming metal wires electrically connecting upper surfaces of the light emitting cells to the metal patterns adjacent to the upper surfaces thereof.

The forming a metal pattern may include reflective metal layers separate from each other on the second conductive semiconductor layer; and forming an intermediate metal layer covering the second conductive semiconductor layer and the reflective metal layers.

According to an embodiment of the present invention, the support substrate is homogeneous with the sacrificial substrate. Thus, when the semiconductor layers and the support substrate are subjected to a bonding process at a high temperature and pressure, deformation of the support substrate can be effectively prevented after the bonding process at the high temperature and pressure since there is no difference in thermal expansion coefficient between the sacrificial substrate and the support substrate. As the support substrate is not deformed, an LLO process, an etching process or a polishing process can be carried out very precisely and easily. As a result, the light emitting diode can be produced at improved yield and with improved luminescence characteristics.

Further, according to an embodiment of the present invention, a plurality of metal layers are formed in the support substrate to effectively emit heat from the light emitting diode, thereby allowing effective manufacture of high power LEDs.

DETAILED DESCRIPTION OF THE ILLUSTRATED EMBODIMENTS

Exemplary embodiments of the present invention will now be described in detail with reference to the accompanying drawings. The embodiments are given by way of illustration for full understanding of the present invention by those skilled in the art. Hence, the present invention is not limited to these embodiments and can be realized in various forms. Further, for convenience of description, width, length, and thickness of components are not drawn to scale in the drawings. The same components will be denoted by the same reference numerals throughout the specification.

Figure 1:
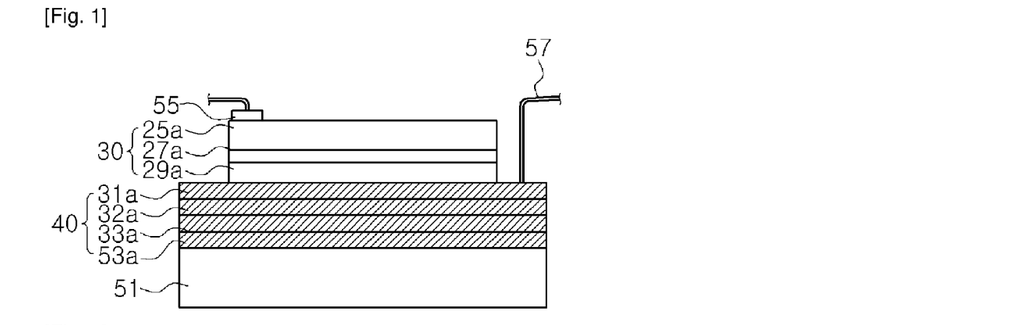
FIG. 1 is a cross-sectional view of a light emitting diode according to an embodiment of the present invention.

FIG. 1 is a cross-sectional view of a light emitting diode according to an embodiment of the present invention.

Referring to FIG. 1, a metal pattern 40 is formed on a support substrate 51. The support substrate 51 may comprise sapphire, AlN or GaN. The support substrate 51 is homogeneous with a sacrificial substrate that is used for growing semiconductor layers constituting a light emitting cell 30. In this embodiment, the support substrate 51 is a sapphire substrate serving as an insulation substrate.

The metal pattern 40 may include a reflective metal layer and/or an intermediate metal layer. Here, the intermediate metal layer is a metal layer interposed between the light emitting cell 30 and the support substrate 51, and is functionally or regionally distinguished from the reflective metal layer when realized along with the reflective metal layer. However, when not including a separate reflective metal layer, the metal pattern 40 may be realized to have the function of the reflective metal layer. The intermediate metal layer may include a protective metal layer. The protective metal layer can protect the reflective metal layer. The intermediate metal layer may include a bonding metal layer for bonding the support substrate 51.

In this embodiment, the metal pattern 40 includes a reflective metal layer 31a, a protective metal layer 32a, a first bonding metal layer 33a, and a second bonding metal layer 53a. However, the present invention is not limited to this configuration, and can be modified in various forms.

The reflective metal layer 31a is formed of a metallic material having high reflectivity, for example, silver (Ag) or aluminum (Al). The protective metal layer 32a is a diffusion preventing layer, which prevents metal elements from being diffused into the reflective metal layer 31a, and can maintain the reflectivity of the reflective metal layer 31a. The protective metal layer 32a may be a single layer or multiple layers, and formed of, for example, Ni, Ti, Ta, Pt, W, Cr, Pd, or the like.

The first and second bonding metal layers 33a and 53a are provided for bonding the reflective metal layer 31a and the support substrate 51, and each may be formed in a single layer or in multiple layers. The first and second bonding metal layers 33a and 53a may be formed of Au, Sn or alloys of Au and Sn (for example, 80/20 wt % or 90/10 wt %). Here, in order to enhance contact characteristics, Cr/Au, Ni or Ti may be further used. Additionally, the first and second bonding metal layers 33a and 53a may be formed using In, Ag or Al.

The light emitting cell 30 is located on at least some regions of each metal pattern. The light emitting cell 30 includes a lower P-type semiconductor layer 29a, an active layer 27a, and an upper N-type semiconductor layer 25a. The active layer 27a is interposed between the P-type semiconductor layer 29a and the N-type semiconductor layer 25a, the locations of which can be changed.

The N-type semiconductor layer 25a may be formed of N-type $Al_xIn_yGa_{1-x-y}N$ ($0 \leq x,y,x+y \leq 1$), and may include an N-type clad layer. Further, the P-type semiconductor layer 29a may be formed of P-type $Al_xIn_yGa_{1-x-y}N$ ($0 \leq x,y,x+y \leq 1$), and may include a P-type clad layer. The N-type semiconductor layer 25a may be formed by doping silicon (Si) and the P-type semiconductor layer 29a may be formed by doping zinc (Zn) or magnesium (Mg).

The active layer 27a serves as a region where electrons and holes are combined, and comprises InGaN. The wavelength of light emitted from the light emitting cell is determined according to the kind of materials constituting the active layer 27a. The active layer 27a may be multiple layers formed by alternately laminating a quantum well layer and a barrier layer. The quantum well layer and the barrier layer may be binary to quaternary-compound semiconductor layers represented by general formula $Al_xIn_yGa_{1-x-y}N$ ($0 \leq x,y,x+y \leq 1$).

A metal wire 57 is formed to supply electric power to the metal pattern 40, and a metal wire 59 is formed to supply electric power to the N-type semiconductor layer 25a. For this purpose, an electrode pad 55 may be formed on the N-type semiconductor layer 25a. The electrode pad 55 reduces contact resistance through ohmic contact with the N-type semiconductor layer 25a.

FIGS. 2 to 6 are cross-sectional views illustrating a method of fabricating a light emitting diode according to an embodiment of the present invention.

Figure 2:
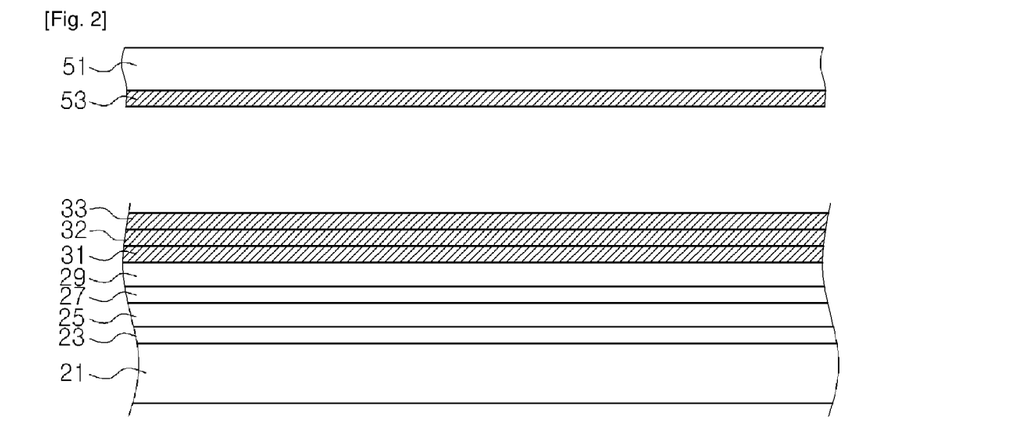
FIGS. 2 to 6 are cross-sectional views illustrating a method of fabricating a light emitting diode according to an embodiment of the present invention.

Referring to FIG. 2, semiconductor layers including a buffer layer 23, an N-type semiconductor layer 25, an active layer 27 and a P-type semiconductor layer 29 are formed on a first substrate 21, followed by forming a reflective metal layer 31 on the semiconductor layers.

Advantageously, the first substrate 21 is transparent like a sapphire substrate and is coherent to lattices of the semiconductor layers.

The buffer layer 23 and the semiconductor layers 25, 27 and 29 may be formed by metal organic chemical vapor deposition (MOCVD), molecular beam epitaxy (MBE), hydride vapor phase epitaxy (HVPE), or the like. Further, the semiconductor layers 25, 27 and 29 may be consecutively formed in a single chamber.

The buffer layer 23 may be formed of a particular material so long as it can reduce lattice mismatch between the first substrate 21 and the semiconductor layers 25, 27 and 29. For example, the buffer layer 23 may be formed of un-doped GaN.

The reflective metal layer 31 is formed of a metal, preferably, a metal with high reflectivity, for example Ag or Al, which forms ohmic-contact with the P-type semiconductor layer. Further, the reflective metal layer is preferably formed of a metal with a high heat transfer rate, for example, Au or a laminate of Au and Sn. A protective metal layer 32 is formed on the reflective metal layer 31. The protective metal layer 32 serves as a diffusion preventing layer. A first bonding metal layer 33 is formed on the protective metal layer 32. The first bonding metal layer 33 is provided for metal bonding and is not limited to a particular material. The first bonding metal layer 33 may be formed of Au, Sn or alloys of Au and Sn (for example, 80/20 wt % or 90/10 wt %) in a single layer or multiple layers. Here, in order to enhance contact characteristics, Cr/Au, Ni or Ti may be further used. Additionally, the first bonding metal layer 33a may be formed using In, Ag or Al.

A second bonding metal layer 53 is formed on a second substrate 51 separate from the first substrate 21. The second substrate 51 is homogeneous with the first substrate 21.

The second bonding metal layer 53 is provided for metal bonding with the first bonding metal layer 33, and is not limited to a particular material. The second bonding metal layer 53 may be formed of Au, Sn or alloys of Au and Sn (for example, 80/20 wt % or 90/10 wt %) in a single layer or multiple layers. Here, in order to enhance contact characteristics, Cr/Au, Ni or Ti may be further used. Additionally, the second bonding metal layer 53a may be formed using In, Ag or Al.

Figure 3:
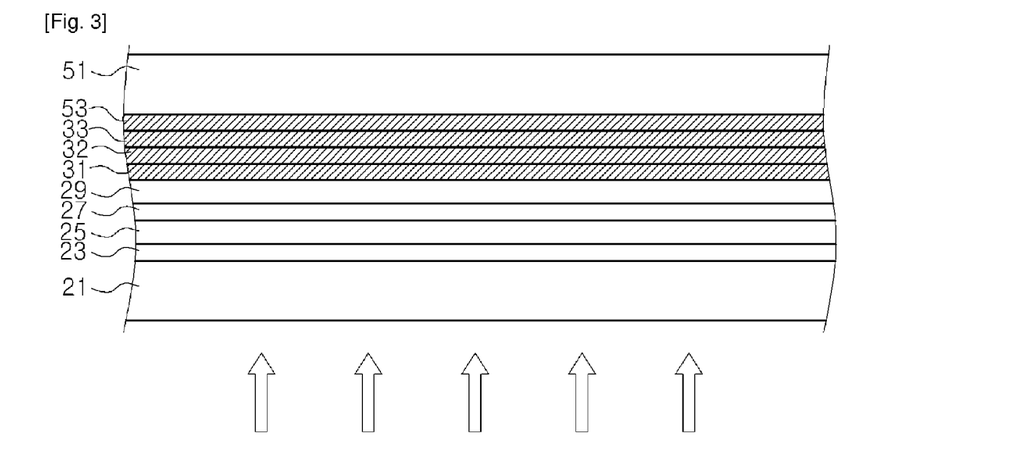

Referring to FIG. 3, the first bonding metal layer 33 and the second bonding metal layer 53 are bonded to each other to face each other. Such bonding can be easily performed through application of a predetermined pressure and/or heat.

Then, a laser is irradiated from a side of the first substrate 21. The laser may be, for example, a KrF (248 nm) laser. Since the first substrate 21 is a transparent substrate like a sapphire substrate, the laser passes through the first substrate 21 and is absorbed by the buffer layer 23. As a result, the buffer layer 23 is decomposed at an interface between the buffer layer 23 and the first substrate 21 by the absorbed radiation energy, so that the substrate 21 is separated from the semiconductor layers.

Figure 4:
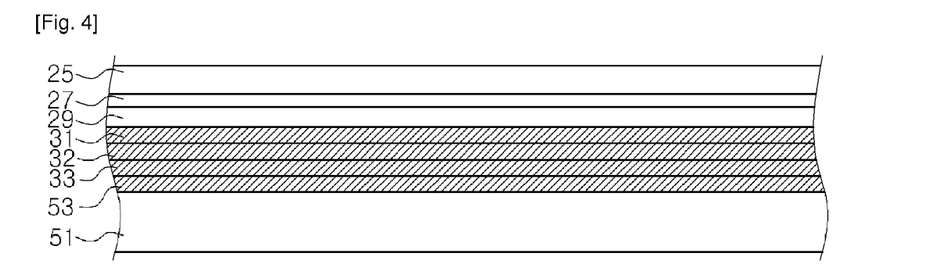

Referring to FIG. 4, after the first substrate 21 is separated from the semiconductor layers, the remaining buffer layer 23 is removed to expose the surface of the N-type semiconductor layer 25. The buffer layer 23 can be removed by etching or polishing.

Figure 5:
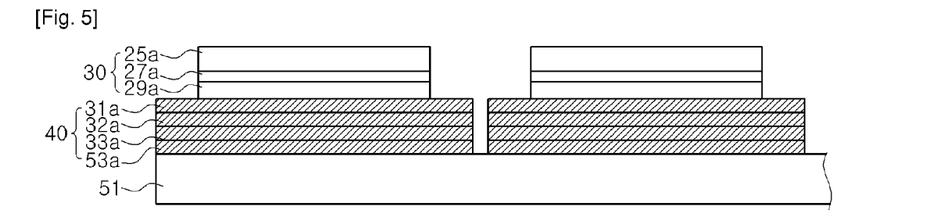

Referring to FIG. 5, the semiconductor layers 25, 27 and 29, and the metal layers 31, 32, 33 and 53 are patterned by photolithography or etching to form metal patterns separated from each other and a light emitting cell 30 located on some regions of each metal pattern.

The light emitting cell 30 includes the P-type semiconductor layer 29a, the active layer 27a, and the N-type semiconductor layer 25a, which are subjected to the patterning process. The semiconductor layers 25a, 27a and 29a may be patterned to have identical shapes.

On the other hand, since the second substrate 51 is an insulation substrate and the metal patterns 40 are separated from each other, the light emitting cells 30 are electrically isolated from each other.

Figure 6:
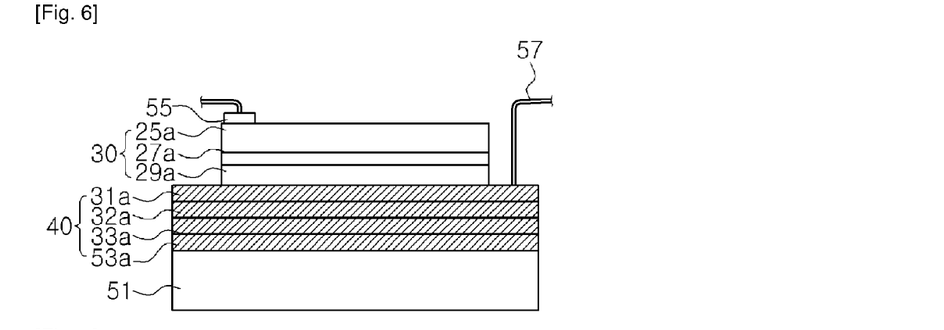

Referring to FIG. 6, with the light emitting cells 30 electrically isolated from each other, the second substrate 51 is divided into individual chips by dicing the second substrate 51 for the respective light emitting cells 30. Then, metal wires 57 and 59 are formed on the respective upper surfaces of the light emitting cells 30 and the metal patterns 40 to supply electric power.

On the other hand, before forming the metal wires, an electrode pad 55 may be formed on the N-type semiconductor layer 25a. The electrode pad 55 forms ohmic-contact with the N-type semiconductor layer 25a. Here, although the metal wire 57 is shown as being connected to a right upper side of the metal pattern in the drawing, the metal wire 57 can be connected to a left upper side thereof, as needed.

In this embodiment, since the metal pattern 40 is formed, it is possible to eliminate a process of forming a separate electrode pad on the P-type semiconductor layer 29a.

According to this embodiment, the P-type semiconductor layer 29 and the N-type semiconductor layer 25 may be formed in a reverse order. In this case, a transparent electrode may be formed on the P-type semiconductor layer 29 after removing the buffer layer 23.

Figure 7:
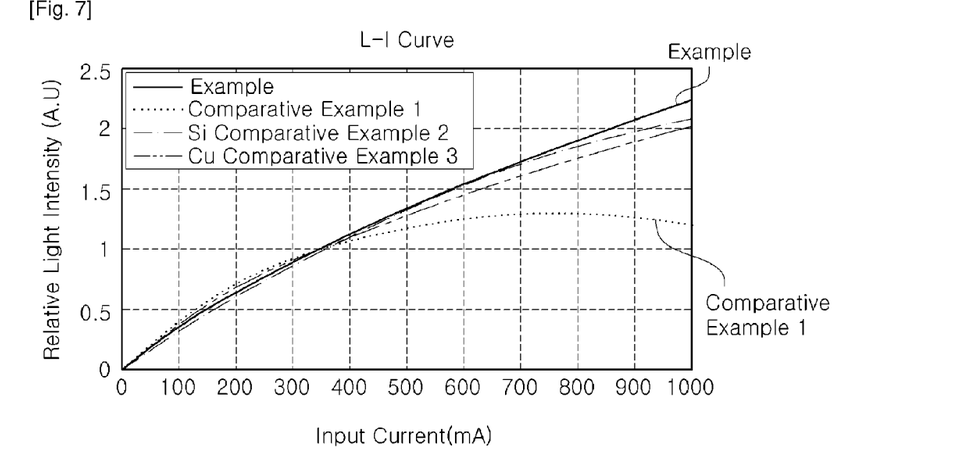
FIGS. 7 and 8 are graphs depicting improved luminescence characteristics of a light emitting diode according to an example of the present invention compared with those of comparative examples.
Figure 8:
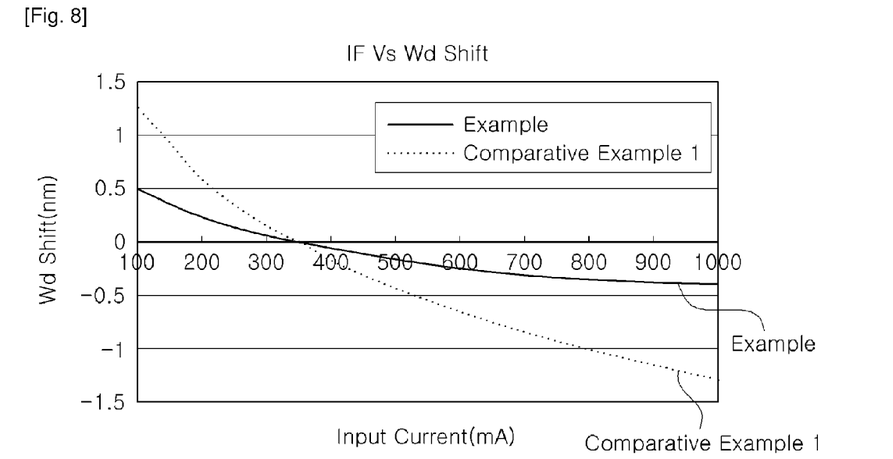

FIGS. 7 and 8 are graphs depicting improved luminescence characteristics of a light emitting diode according to an example of the present invention compared with those of comparative examples.

In the FIG. 7, example of the present invention is compared with the comparative examples 1 to 4, and in the FIG. 8, example of the present invention is compared with the comparative example 1.

EXAMPLE

A light emitting diode fabricated by growing semiconductor layers on a sacrificial substrate formed of sapphire, followed by using a sapphire substrate as a support substrate and separating the sacrificial substrate.

Comparative Example 1

A light emitting diode fabricated by growing semiconductor layers on a sacrificial substrate formed of sapphire, followed by using this substrate without separation thereof.

Comparative Example 2

A light emitting diode fabricated by growing semiconductor layers on a sacrificial substrate formed of sapphire, followed by using a Si-substrate as a support substrate and separating the sacrificial substrate.

Comparative Example 3

A light emitting diode fabricated by growing semiconductor layers on a sacrificial substrate formed of sapphire, followed by using a Cu-substrate as a support substrate and separating the sacrificial substrate.

Referring to FIG. 7, it can be seen that the light emitting diode of the Example exhibited improved relative light intensity with respect to input current, as compared with those of Comparative Examples 1 to 3.

The substrate of Comparative Example 1 was the sapphire substrate, which was used as the support substrate in the Example. However, in the light emitting diode of Comparative Example 1, the sapphire substrate used to grow the semiconductor layers was used without being separated.

On the other hand, in the light emitting diode of the Example, the sapphire substrate was used as the support substrate, thereby preventing deformation of the semiconductor layers during manufacture of the light emitting diode after separating the sapphire substrate used as the sacrificial substrate. Further, the light emitting diode of the Example included a metal pattern between the support substrate and the semiconductor layers, thereby improving an effect of spreading electric current.

In Comparative Example 2, after the semiconductor layers were grown on the sacrificial substrate of sapphire, the Si-substrate was used as the support substrate. For Comparative Example 2, the relative light intensity with respect to input current was most similar to that of the Example. However, the Si-substrate has a different thermal expansion coefficient than the sacrificial substrate of sapphire. Thus, when performing a process of bonding the semiconductor layers to the support substrate at high temperature and pressure, the semiconductor layers and support substrate are concavely deformed towards the sacrificial substrate. If the deformation of the semiconductor layers and support substrate toward the sacrificial substrate occurs, precision of an LLO process, an etching process or a polishing process is deteriorated, thereby reducing yield of the light emitting diode. Further, this substrate is likely to be broken when the substrate is picked up and transferred by a certain device during manufacture of the light emitting diode.

Further, in Comparative Example 3, after the semiconductor layers were grown on the sacrificial substrate of sapphire, the Cu-substrate was used as the support substrate. However, since a metallic substrate such as a Cu substrate is not rigid, the substrate is liable to deform when the substrate is picked up and transferred by a certain device during manufacture of the light emitting diode. On the contrary, the sapphire substrate used as the support substrate of the Example is not deformed when picked up and transferred by a certain device during manufacture of the light emitting diode.

Referring to FIG. 8, it can be seen that the light emitting diode of the Example exhibited improved wavelength shift (Wd shift) according to input current, as compared with that of Comparative Example 1.

Figure 9:
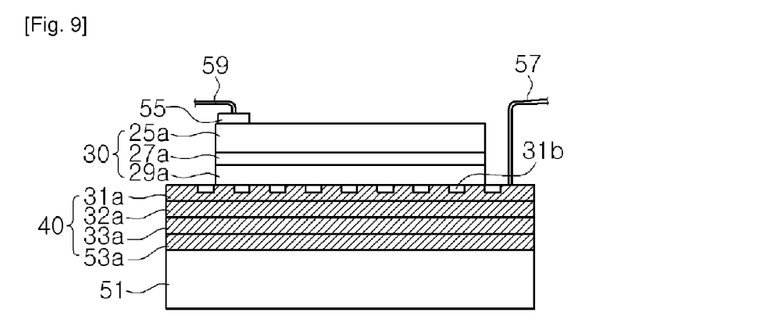
FIG. 9 is a cross-sectional view of a light emitting diode according to another embodiment of the present invention.

FIG. 9 is a cross-sectional view of a light emitting diode according to another embodiment of the present invention.

Referring to FIG. 9, a Distributed Bragg Reflector (DBR) pattern 31b is formed in a reflective metal layer 31a. The DBR pattern 31b adjoins a lower surface of a P-type semiconductor layer 29 and is constituted by DBRs spaced from each other. The DBR pattern 31b may be formed in multiple layers by alternately laminating insulation layers having different indexes of refraction.

The DBR pattern 31b is formed by alternately laminating two kinds of mediums having different indexes of refraction, and can reflect light based on a difference in the indexes of refraction thereof. The DBR pattern 31b allows effective scattering of light and compensates for optical reflection of the reflective metal layer 31a by primarily reflecting light generated from the active layer 27a through increase in reflectivity.

The DBR pattern 31b may be formed by alternately laminating two or more insulation layers having different indexes of refraction. For example, the DBR pattern 31b may be formed by alternately laminating an $SiO_2$ layer and an $Si_3N_4$ layer in multiple layers. Referring to FIG. 1, after sequentially forming an N-type semiconductor layer 27, an active layer 28, and a P-type semiconductor layer 29, the DBR pattern 31b is formed by alternately laminating two or more insulation layers having different indexes of refraction in multiple layer on the P-type semiconductor layer 29, followed by etching the laminated insulating layers according to a predetermined pattern via photolithography.

Then, a reflective metal layer 31a is formed so as to cover the P-type semiconductor layer 29 and the DBR pattern 31b, thereby realizing the DBR pattern 31b that is formed in the reflective metal layer 31a.

The DBR pattern 31b improves a bonding force between the P-type semiconductor layer 29 and the reflective metal layer 31a while compensating for the optical reflection of the reflective metal layer 31a. The DBR pattern 31b provides a higher bonding force with respect to the p-type semiconductor layer 29 than the reflective metal layer 31a. Accordingly, when bonding the p-type semiconductor layer 29 to the reflective metal layer 31a with the DBR pattern 31b interposed therebetween, the bonding force between the P-type semiconductor layer 29 and the reflective metal layer 31a is increased by the bonding characteristics between the reflective metal layer 31a and the DBR pattern 31b, as compared to when the p-type semiconductor layer 29 is bonded to the reflective metal layer 31a without any medium.

Figure 10:
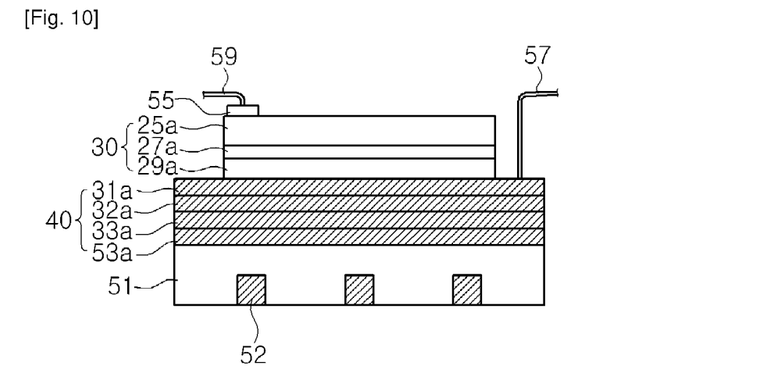
FIGS. 10 to 12 are cross-sectional views of light emitting diodes according to other embodiments of the present invention.
Figure 11:
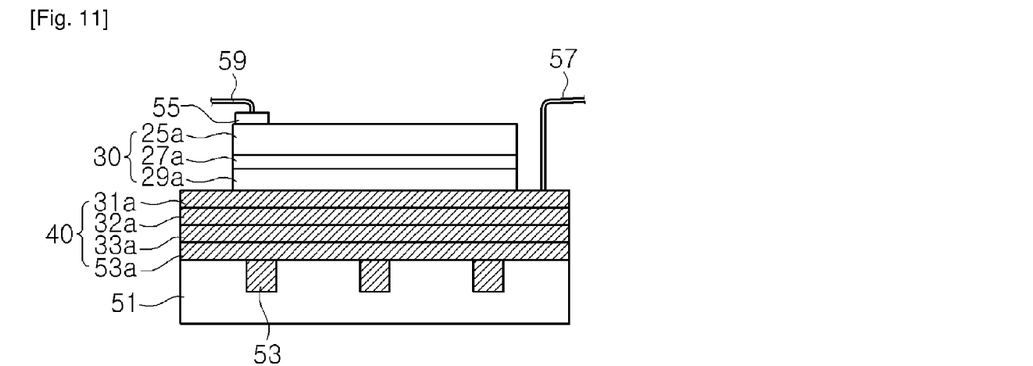
Figure 12:
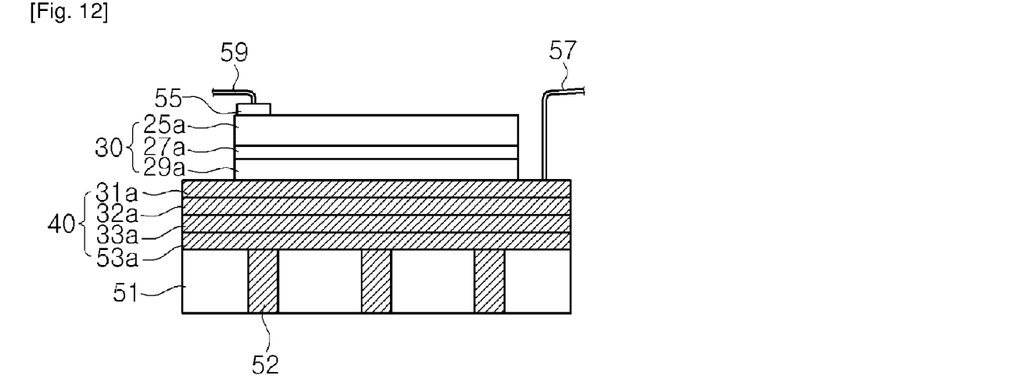

FIGS. 10 to 12 are cross-sectional views of light emitting diodes according to other embodiments of the present invention. Referring to FIGS. 10 to 12, a plurality of grooves or through-holes are formed at a lower or upper portion of a second substrate 51, and filled with a metal to form metal layers 52, 53 and 54. As such, the metal layers 52, 53 and 54 are sporadically formed in the substrate 51 so that heat can be effectively discharged through the metal layers. This process is performed in the preparation of the substrate before forming the second bonding metal layer 53 on the second substrate 51. Further, in the case of forming the grooves at the lower portion of the second substrate 51 as shown in FIG. 10, the plurality of grooves may be formed to a predetermined depth in the second substrate 51 that is thicker than that shown in FIG. 10, and filled with a metallic material, followed by polishing the lower surface of the second substrate 51 to have the same thickness as that shown in FIG. 10.

Figure 13:
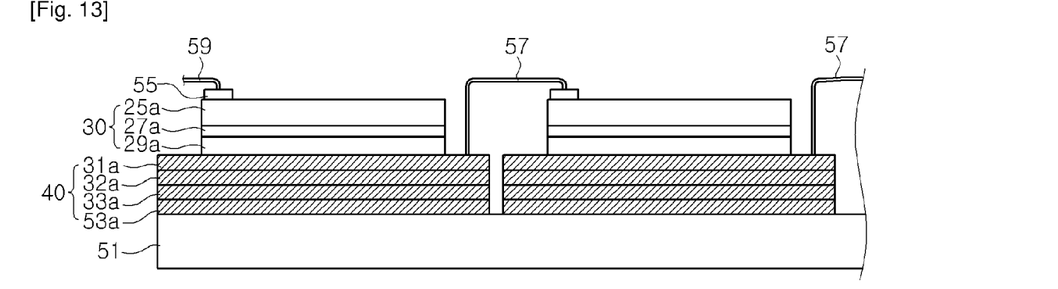
FIG. 13 is a cross-sectional view of a light emitting diode according to yet another embodiment of the present invention.

FIG. 13 is a cross-sectional view of a light emitting diode according to yet another embodiment of the present invention.

Referring to FIG. 13, plural metal patterns 40 are spaced from each other on a support substrate 51. The support substrate 51 may comprise sapphire, AlN or GaN. The support substrate 51 is homogeneous with a substrate that is used for growing semiconductor layers constituting light emitting cells 30. In this embodiment, the support substrate 51 is a sapphire substrate serving as an insulation substrate.

The metal pattern 40 may include a reflective metal layer and/or an intermediate metal layer. Here, the intermediate metal layer is a metal layer interposed between the light emitting cells 30 and the support substrate 51, and is functionally or regionally distinguished from the reflective metal layer when realized along with the reflective metal layer. However, when not including a separate reflective metal layer, the metal pattern 40 may be realized to have the function of the reflective metal layer. The intermediate metal layer may include a protective metal layer. The protective metal layer can protect the reflective metal layer. The intermediate metal layer may include a bonding metal layer for bonding the support substrate 51.

In this embodiment, the metal pattern 40 includes a reflective metal layer 31a, a protective metal layer 32a, a first bonding metal layer 33a, and a second bonding metal layer 53a. However, the present invention is not limited to this configuration, and can be modified in various forms.

The reflective metal layer 31a is formed of a metallic material having high reflectivity, for example, silver (Ag) or aluminum (Al). The protective metal layer 32a is a diffusion preventing layer, which prevents metal elements from being diffused into the reflective metal layer 31a, and can maintain the reflectivity of the reflective metal layer 31a. The protective metal layer 32a may be a single layer or multiple layers, and formed of, for example, Ni, Ti, Ta, Pt, W, Cr, Pd, or the like.

The first and second bonding metal layers 33a and 53a are provided for bonding the reflective metal layer 31a and the support substrate 51, and each may be formed in a single layer or in multiple layers. The first and second bonding metal layers 33a and 53a may be formed of Au, Sn or alloys of Au and Sn (for example, 80/20 wt % or 90/10 wt %). Here, in order to enhance contact characteristics, Cr/Au, Ni or Ti may be further used. Additionally, the first and second bonding metal layers 33a and 53a may be formed using In, Ag or Al.

The light emitting cell 30 is located on at least some regions of each metal pattern. The light emitting cell 30 includes a lower P-type semiconductor layer 29a, an active layer 27a, and an upper N-type semiconductor layer 25a. The active layer 27a is interposed between the P-type semiconductor layer 29a and the N-type semiconductor layer 25a, the locations of which can be changed.

The N-type semiconductor layer 25a may be formed of N-type $Al_xIn_yGa_{1-x-y}N$ ($0 \leq x,y,x+y \leq 1$), and may include an N-type clad layer. Further, the P-type semiconductor layer 29a may be formed of P-type $Al_xIn_yGa_{1-x-y}N$ ($0 \leq x,y,x+y \leq 1$), and may include a P-type clad layer. The N-type semiconductor layer 25a may be formed by doping silicon (Si), and the P-type semiconductor layer 29a may be formed by doping zinc (Zn) or magnesium (Mg).

The active layer 27a serves as a region where electrons and holes are combined, and comprises InGaN. The wavelength of light emitted from the light emitting cell is determined according to the kind of materials constituting the active layer 27a. The active layer 27a may be multiple layers formed by alternately laminating a quantum well layer and a barrier layer. The quantum well layer and the barrier layer may be binary to quaternary-compound semiconductor layers represented by general formula $Al_xIn_yGa_{1-x-y}N$ ($0 \leq x,y,x+y \leq 1$).

On the other hand, metal wires 57 and 59 are formed to electrically connect the N-type semiconductor 25a to the metal patterns 40 adjacent thereto. For this purpose, an electrode pad 55 may be formed on each N-type semiconductor 25a. The electrode pad 55 reduces contact resistance through ohmic contact with the N-type semiconductor layer 25a. Accordingly, the metal wire 57 connects the light emitting cells 30 to each other by connecting the electrode pad 55 to the reflective metal layer 31a as shown in the drawing. The light emitting cells 30 connected by the metal wires 57 constitute an array of light emitting cells connected in series. Two or more arrays of light emitting cells connected in series can be formed on the substrate 51, and can be connected antiparallel to each other to be driven by alternating current.

Figure 14:
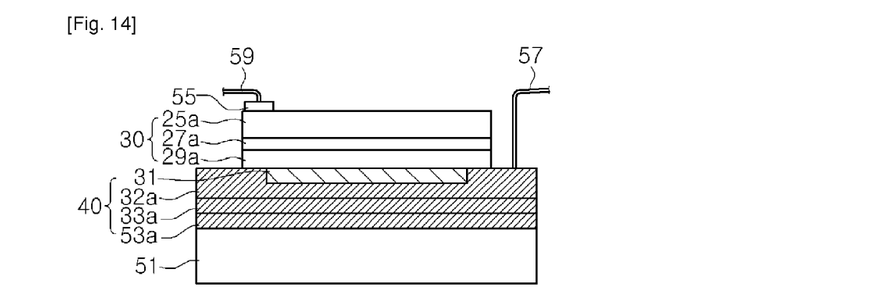
FIG. 14 is a cross-sectional view of a light emitting diode according to yet another embodiment of the present invention.

FIG. 14 is a cross-sectional view of a light emitting diode according to yet another embodiment of the present invention.

Referring to FIG. 14, a metal pattern 40 is located on a support substrate 51. The support substrate 51 may comprise sapphire, AlN or GaN. The support substrate 51 is homogeneous with a sacrificial substrate that is used for growing semiconductor layers constituting a light emitting cell 30. In this embodiment, the support substrate 51 is a sapphire substrate serving as an insulation substrate.

The metal pattern 40 may include a reflective metal layer on at least some region of a lower surface of the P-type semiconductor layer 29a, and an intermediate metal layer covering the reflective metal layer. Here, the intermediate metal layer is a metal layer interposed between the light emitting cell 30 and the support substrate 51 to cover the reflective metal layer between the light emitting cell 30 and the support layer 51. The intermediate metal layer may include a protective metal layer. The protective metal layer can protect the reflective metal layer. The protective metal layer may be formed in a single layer or multiple layers. The intermediate metal layer may include a bonding metal layer that is formed in a single layer or multiple layers for bonding the support substrate 51.

In this embodiment, the metal pattern 40 includes a reflective metal layer 31, a protective metal layer 32a, a first bonding metal layer 33a, and a second bonding metal layer 53a. However, the present invention is not limited to this configuration, and can be modified in various forms.

The reflective metal layer 31 is formed of a metallic material having high reflectivity, for example, silver (Ag) or aluminum (Al). The protective metal layer 32a is a diffusion preventing layer, which prevents metal elements from being diffused into the reflective metal layer 31, and can maintain the reflectivity of the reflective metal layer 31. The protective metal layer 32a may be a single layer or multiple layers, and formed of, for example, Ni, Ti, Ta, Pt, W, Cr, Pd, or the like.

The first and second bonding metal layers 33a and 53a are provided for bonding the reflective metal layer 31 and the support substrate 51, and each may be formed in a single layer or in multiple layers. The first and second bonding metal layers 33a and 53a may be formed of Au, Sn or alloys of Au and Sn (for example, 80/20 wt % or 90/10 wt %). Here, in order to enhance contact characteristics, Cr/Au, Ni or Ti may be further used. Additionally, the first and second bonding metal layers 33a and 53a may be formed using In, Ag or Al.

The light emitting cell 30 is located on at least some regions of each metal pattern. The light emitting cell 30 includes a lower P-type semiconductor layer 29a, an active layer 27a, and an upper N-type semiconductor layer 25a. The active layer 27a is interposed between the P-type semiconductor layer 29a and the N-type semiconductor layer 25a, the locations of which can be changed.

The N-type semiconductor layer 25a may be formed of N-type $Al_xIn_yGa_{1-x-y}N$ ($0 \leq x,y,x+y \leq 1$), and may include an N-type clad layer. Further, the P-type semiconductor layer 29a may be formed of P-type $Al_xIn_yGa_{1-x-y}N$ ($0 \leq x,y,x+y \leq 1$), and may include a P-type clad layer. The N-type semiconductor layer 25a may be formed by doping silicon (Si), and the P-type semiconductor layer 29a may be formed by doping zinc (Zn) or magnesium (Mg).

The active layer 27a serves as a region where electrons and holes are combined, and comprises InGaN. The wavelength of light emitted from the light emitting cell is determined according to the kind of materials constituting the active layer 27a. The active layer 27a may be multiple layers formed by alternately laminating a quantum well layer and a barrier layer. The quantum well layer and the barrier layer may be binary to quaternary-compound semiconductor layers represented by general formula $Al_xIn_yGa_{1-x-y}N$ ($0 \leq x,y,x+y \leq 1$).

A metal wire 57 is formed to supply electric power to the metal pattern 40, and a metal wire 59 is formed to supply electric power to the N-type semiconductor layer 25a. For this purpose, an electrode pad 55 may be formed on each N-type semiconductor layer 25a. The electrode pad 55 reduces contact resistance through ohmic contact with the N-type semiconductor layer 25a.

FIGS. 15 to 20 are cross-sectional view illustrating a method of fabricating a light emitting diode shown in FIG. 14.

Figure 15:
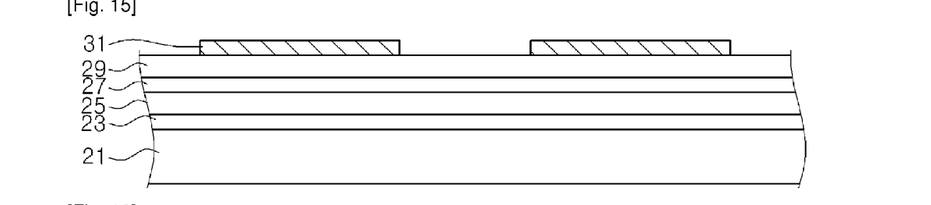
FIGS. 15 to 20 are cross-sectional views illustrating a method of fabricating the light emitting diode shown in FIG. 14.

Referring to FIG. 15, semiconductor layers including a buffer layer 23, an N-type semiconductor layer 25, an active layer 27 and a P-type semiconductor layer 29 are formed on a first substrate 21, followed by forming reflective metal layers 31 separated from each other on the semiconductor layers.

Advantageously, the first substrate 21 is transparent like a sapphire substrate and coherent to lattices of the semiconductor layers.

The buffer layer 23 and the semiconductor layers 25, 27 and 29 may be formed by metal organic chemical vapor deposition (MOCVD), molecular beam epitaxy (MBE), hydride vapor phase epitaxy (HVPE), or the like. Further, the semiconductor layers 25, 27 and 29 may be consecutively formed in a single chamber.

The buffer layer 23 may be formed of a particular material so long as it can release lattice mismatch between the first substrate 21 and the semiconductor layers 25, 27 and 29. For example, the buffer layer 23 may be formed of un-doped GaN.

The reflective metal layer 31 is formed of a metal, preferably, a metal with high reflectivity, for example Ag, Al, an Ag alloy or an Al alloy, which forms ohmic-contact with the P-type semiconductor layer 29. Further, the reflective metal layer 31 is preferably formed of a metal with a high heat transfer rate, for example, Au, or a laminate of Au and Sn. The reflective metal layer 31 may be formed by plating or deposition via, for example, a lift-off process.

Figure 16:
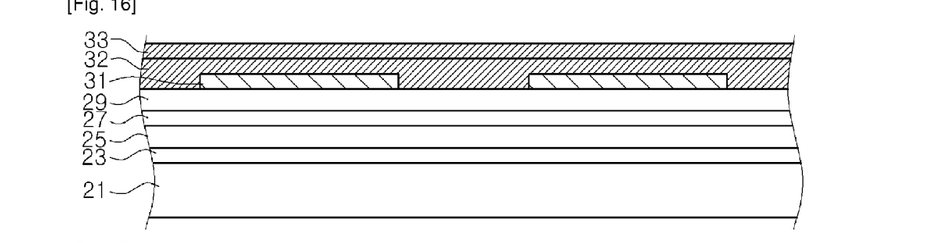

Referring to FIG. 16, a protective metal layer 32 is formed on the P-type semiconductor layer 29 and the reflective metal layer 31. The protective metal layer 32 is formed to cover the reflective metal layer 31, and serves as a diffusion preventing layer. A first bonding metal layer 33 is formed on the protective metal layer 32. The first bonding metal layer 33 is provided for metal bonding and is formed, but is not limited to, of Au or a laminate of Au and Sn.

Figure 17:
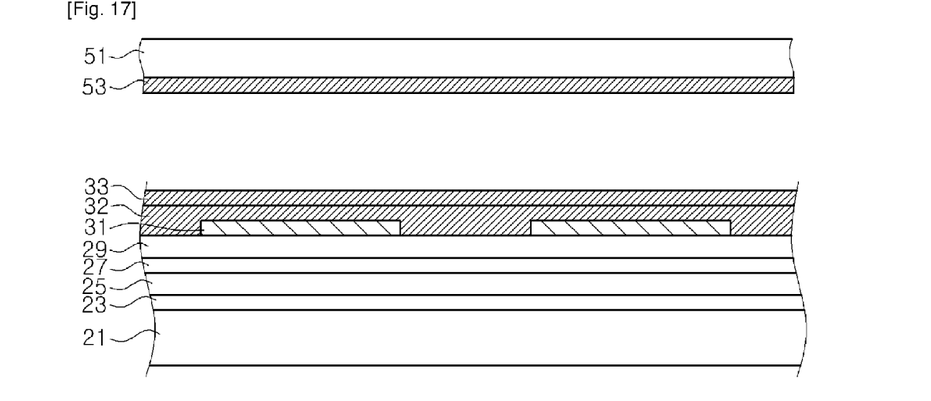

Referring to FIG. 17, a second bonding metal layer 53 is formed on a second substrate 51 separate from the first substrate 21. The second substrate 51 is homogeneous with the first substrate 21.

The second bonding metal layer 53 is provided for metal bonding with the first intermediate metal layer 31, and is not limited to a particular material. The second bonding metal layer 53 may be formed of Au, Sn or alloys of Au and Sn (for example, 80/20 wt % or 90/10 wt %) in a single layer or multiple layers. Here, in order to enhance contact characteristics, Cr/Au, Ni or Ti may be further used. Additionally, the second bonding metal layer 53a may further comprise In, Ag or Al.

Figure 18:
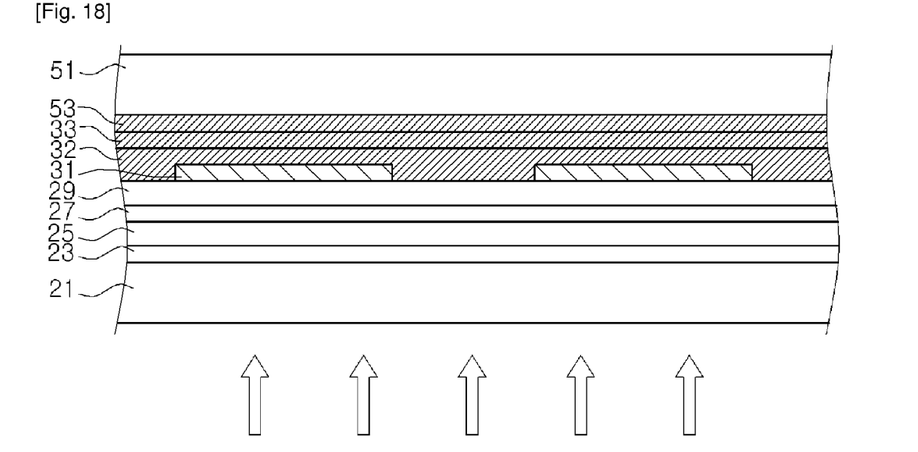

Referring to FIG. 18, the first bonding metal layer 33 and the second bonding metal layer 53 are bonded to each other to face each other. Such bonding can be easily performed through application of a predetermined pressure and/or heat. Then, a laser is irradiated from a side of the first substrate 21. The laser may be, for example, a KrF (248 nm) laser. Since the first substrate 21 is a transparent substrate like a sapphire substrate, the laser passes through the first substrate 21 and is absorbed by the buffer layer 23. As a result, the buffer layer 23 is decomposed at an interface between the buffer layer 23 and the first substrate 21 by the absorbed radiation energy, so that the substrate 21 is separated from the semiconductor layers.

Figure 19:
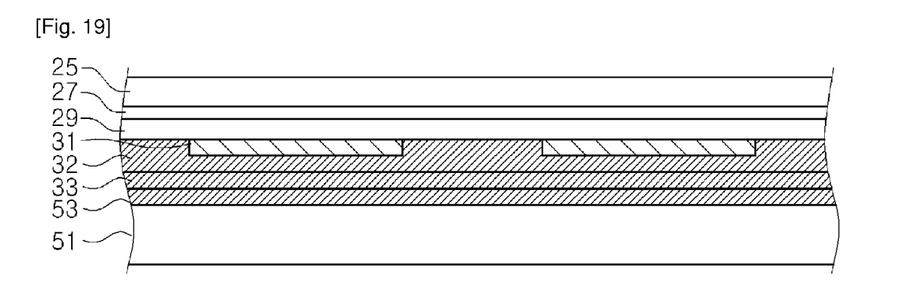

Referring to FIG. 19, after the first substrate 21 is separated from the semiconductor layers, the remaining buffer layer 23 is removed to expose the surface of the N-type semiconductor layer 25. The buffer layer 23 can be removed by etching or polishing.

Figure 20:
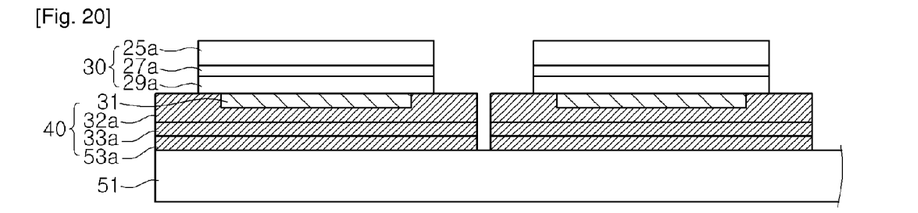

Referring to FIG. 20, the semiconductor layers 25, 27 and 29, and the metal layers 31, 32, 33 and 53 are patterned by photolithography or etching to form metal patterns separated from each other and a light emitting cell 30 located on some regions of each metal pattern.

The light emitting cell 30 includes the P-type semiconductor layer 29a, the active layer 27a, and the N-type semiconductor layer 25a, which are subjected to the patterning process. The semiconductor layers 25a, 27a and 29a may be patterned to have identical shapes.

On the other hand, since the second substrate 51 is an insulation substrate and the metal patterns 40 are separated from each other, the light emitting cells 30 are electrically isolated from each other.

With the light emitting cells 30 electrically isolated from each other, the second substrate 51 is divided into individual chips by dicing the second substrate 51 for the respective light emitting cells 30. Then, metal wires 57 and 59 are formed on the respective upper surfaces of the light emitting cell 30 and the metal pattern 40, thereby providing a light emitting diode as shown in FIG. 14.

On the other hand, before forming the metal wires, an electrode pad 55 may be formed on the N-type semiconductor layer 25a. The electrode pad 55 forms ohmic-contact with the N-type semiconductor layer 25a. Here, although the metal wire 57 is shown as being connected to a right upper side of the metal pattern in the drawing, the metal wire 57 can be connected to a left upper side thereof, as needed.

In this embodiment, since the metal pattern 40 is formed, it is possible to eliminate a process of forming a separate electrode pad on the P-type semiconductor layer 29a.

On the other hand, according to this embodiment, the P-type semiconductor layer 29 and the N-type semiconductor layer 25 may be formed in a reverse order. In this case, a transparent electrode may be formed on the P-type semiconductor layer 29 after removing the buffer layer 23.

According to another embodiment of the invention, instead of dicing the second substrate 51 for the respective light emitting cells 30 to divide the second substrate 51 into individual chips with the light emitting cells 30 electrically isolated from each other, the N-type semiconductor layer 25a may be electrically connected to the metal patterns 40 adjacent to the N-type semiconductor layer 25a via the metal wires 57 and 59. The light emitting cells 30 connected by the metal wires 57 constitute an array of light emitting cells connected in series. Two or more arrays of light emitting cells connected in series can be formed on the substrate 51, and can be connected anti-parallel to each other to be driven by alternating current.

Figure 21:
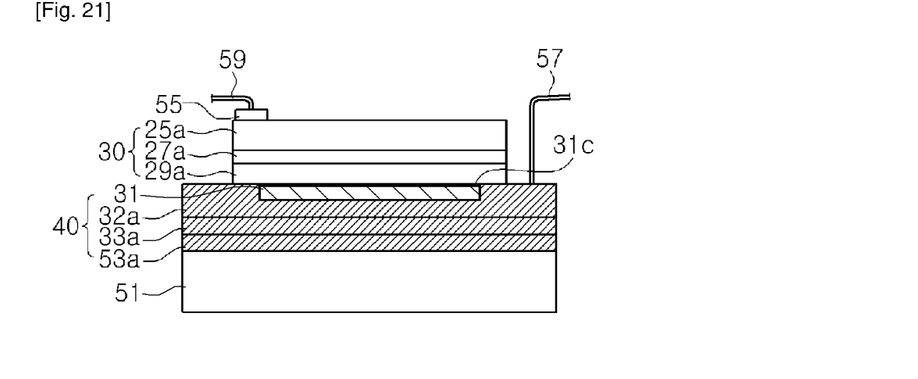
FIG. 21 is a cross-sectional view of a light emitting diode according to yet another embodiment of the present invention.

FIG. 21 is a cross-sectional view of a light emitting diode according to yet another embodiment of the present invention.

Referring to FIG. 21, the configuration and operation of the light emitting diode according to this embodiment are similar to those of the light emitting diode illustrated in FIG. 14. However, the light emitting diode of this embodiment has an indium tin oxide (ITO) layer 31c between a lower surface of the P-type semiconductor layer 29a and the reflective metal layer 31.

The ITO layer 31c may function as an ohmic contact layer with respect to the P-type semiconductor layer 29a and the reflective metal layer 31. Accordingly, the ITO layer 31c can enhance luminescence characteristics by improving the ohmic characteristics between the P-type semiconductor layer 29a and the reflective metal layer 31.

Although the present invention has been described with reference to the embodiments, this invention is not limited to the embodiments, and various modifications and changes can be made by a person having ordinary knowledge in the art without departing from the scope and spirit of the invention as defined by the accompanying claims.

Further, although the metal wire connecting the light emitting cells is illustrated as having an air-bridge shape in the embodiments of the invention, it can be realized in any shape through a step-cover process.

The invention claimed is:

1. A light emitting diode, comprising:
   a support substrate;
   an upper semiconductor layer of a first conductive type, an active layer, and a lower semiconductor layer of a second conductive type arranged on the support substrate; and
   a metal pattern arranged between the support substrate and the lower semiconductor layer,
   the semiconductor layers being grown on a sacrificial substrate and the support substrate being homogeneous with the sacrificial substrate.

2. The light emitting diode of claim 1, wherein the support substrate comprises sapphire.

3. The light emitting diode of claim 1, wherein the support substrate comprises a plurality of grooves or through-holes filled with a metal formed in an upper portion or lower portion of the support substrate.

4. The light emitting diode of claim 1, wherein the metal pattern comprises a reflective metal layer arranged on at least a portion of a lower surface of the lower semiconductor layer, and an intermediate metal layer covering the reflective metal layer.

5. The light emitting diode of claim 4, wherein the intermediate metal layer comprises a protective metal layer comprising at least one layer.

6. The light emitting diode of claim 4, wherein the intermediate metal layer comprises a bonding metal layer comprising at least one layer.

7. The light emitting diode of claim 4, further comprising:
   an indium tin oxide (ITO) layer arranged between the lower semiconductor layer and the reflective metal layer.

8. The light emitting diode of claim 1, wherein the metal pattern comprises:
   a reflective metal layer arranged on a lower surface of the lower semiconductor layer; and
   an intermediate metal layer arranged between the reflective metal layer and the support substrate,
   wherein the lower semiconductor layer is arranged on at least a portion of the reflective metal layer.

9. The light emitting diode of claim 8, wherein the reflective metal layer comprises at least one Distribution Bragg Reflector (DBR) layer formed therein.

10. The light emitting diode of claim 1, further comprising:
    an electrode pad arranged on at least one of the upper semiconductor layer or the metal pattern.

11. A light emitting diode, comprising:
    a support substrate;
    a plurality of metal patterns spaced from each other on the support substrate;
    a plurality of light emitting cells arranged on at least one region of the respective metal patterns, each light emitting cell comprising an upper semiconductor layer of a first conductive type, an active layer and a lower semiconductor layer of a second conductive type; and at least one metal wire electrically connecting an upper surface of a first light emitting cell to the metal pattern adjacent to and spaced apart from the upper surface thereof, the semiconductor layers being grown on a sacrificial substrate and the support substrate being homogeneous with the sacrificial substrate.

12. The light emitting diode of claim 11, wherein the support substrate comprises sapphire.

13. The light emitting diode of claim 11, wherein the support substrate comprises a plurality of grooves or through-holes filled with a metal formed in an upper portion or lower portion of the support substrate.

14. The light emitting diode of claim 11, wherein the metal patterns comprise a reflective metal layer arranged on at least a portion of a lower surface of the lower semiconductor layer, and an intermediate metal layer covering the reflective metal layer.

15. The light emitting diode of claim 14, wherein the intermediate metal layer comprises a protective metal layer comprising at least one layer.

16. The light emitting diode of claim 14, wherein the intermediate metal layer comprises a bonding metal layer comprising at least one layer.

17. The light emitting diode of claim 11, wherein the metal patterns comprise:

a reflective metal layer arranged on a lower surface of the lower semiconductor layer; and an intermediate metal layer arranged between the reflective metal layer and the support substrate, the semiconductor layers is arranged on at least a portion of the reflective metal layer.

* * * * *